United States Patent [19]

Shapiro

[11] 4,400,818
[45] Aug. 23, 1983

[54] ROTARY SWITCH SIMULATOR

[75] Inventor: Ira P. Shapiro, Phoenixville, Pa.

[73] Assignee: Burroughs Corporation, Detroit, Mich.

[21] Appl. No.: 229,551

[22] Filed: Jan. 29, 1981

[51] Int. Cl.³ .............................................. G06M 3/06
[52] U.S. Cl. ........................................ 377/54; 377/55; 377/90
[58] Field of Search .............. 235/92 A, 92 K, 92 PE, 235/92 DE, 92 ST, 92 SH, 92 TE, 103, 145 R; 328/48; 307/220 R; 340/363, 364, 365 S; 364/705; 377/17, 33, 37, 54-56, 86, 88, 90

[56] References Cited

U.S. PATENT DOCUMENTS

| 3,534,398 | 10/1970 | Wajda | 328/48 |
|---|---|---|---|
| 3,564,217 | 2/1971 | Bounsall | 235/92 PE |
| 3,784,979 | 1/1974 | Friedman et al. | 235/92 ST |
| 3,877,018 | 4/1975 | Hakozaki | 377/55 |
| 3,928,789 | 12/1975 | Elias | 340/365 S |
| 4,106,012 | 8/1978 | Knight | 377/55 |
| 4,193,539 | 3/1980 | Bowman et al. | 235/92 SH |
| 4,229,647 | 10/1980 | Burkhardt | 235/92 PE |
| 4,347,434 | 8/1982 | Kovalick | 235/92 SH |

Primary Examiner—Gary Chin
Attorney, Agent, or Firm—Mark T. Starr; Edmund M. Chung; Kevin R. Peterson

[57] ABSTRACT

A rotary-type switch simulator includes a shift register and a counter, both clocked by a momentary contact switch. The shift register outputs drive visual indicators indicating the selected switch position, while the counter provides a binary output corresponding to the indicated switch position. Logic circuitry, responsive to selected data bits at the outputs of the shift register and counter, reset the shift register and counter respectively to their initial states after the highest switch position has been accessed.

12 Claims, 1 Drawing Figure

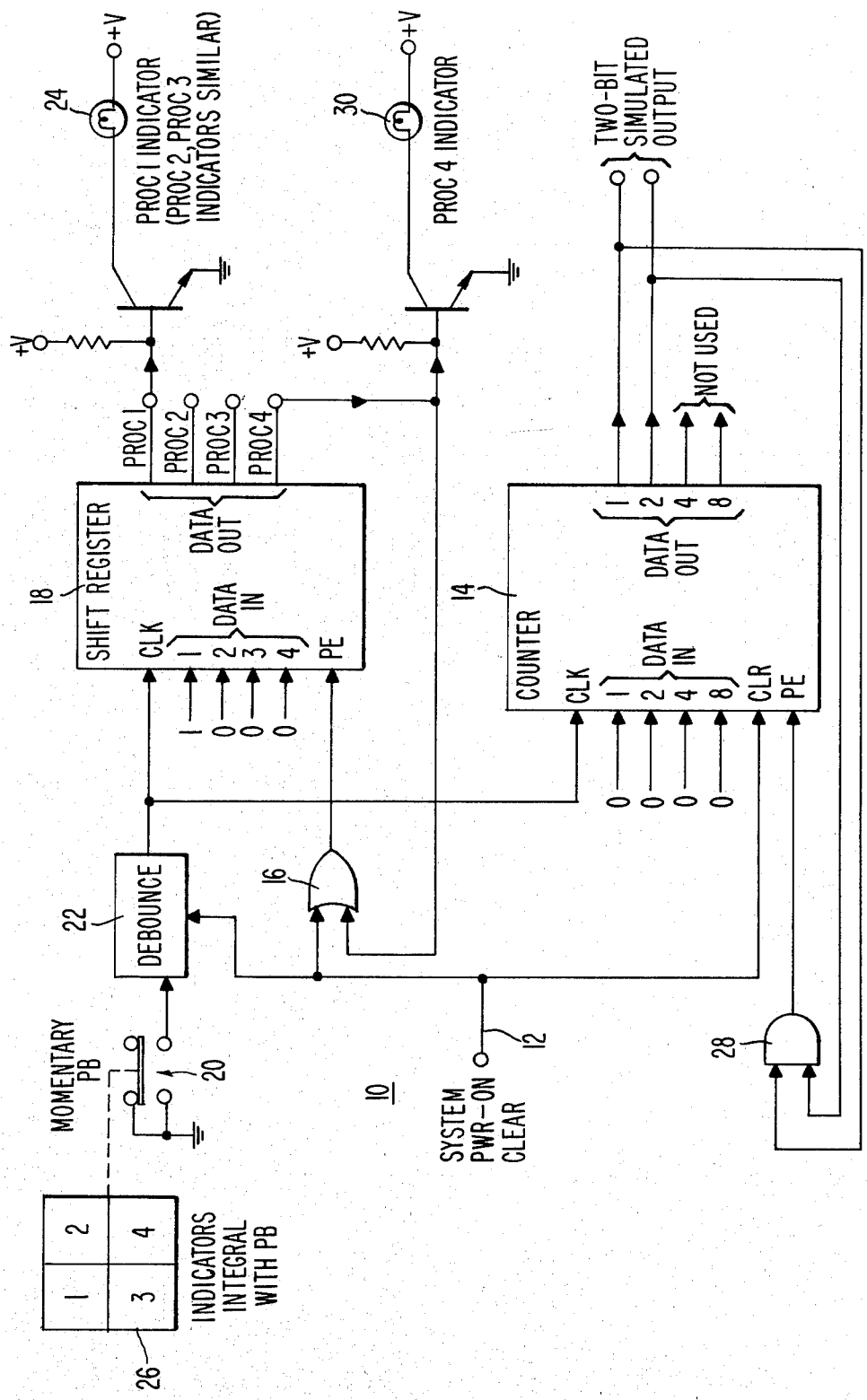

ROTARY SWITCH SIMULATOR

BACKGROUND OF THE INVENTION

The present invention pertains to a pushbutton-actuated counting selector switch which provides an ordered set of n outputs, the next sequential output being selected and visually identified each time the pushbutton is actuated, the sequence of outputs being repeated after n sequential pushbutton actuations.

In the prior art, various approaches have been used to detect that a counter has reached a certain value and then reset the counter to some new value. Thus, in U.S. Pat. No. 3,962,565, issued June 8, 1976 to Bao-Dam N. Guyen-Phuoc, an apparatus is provided which automatically presets an electric pulse counter to a predetermined initial count. The apparatus includes a pulse generator which is connected during a preset operation, to the count input of the counter through an electronic gate. The electronic gate, in response to an auxiliary circuit detecting an overflow at the output of the pulse counter, actuates the pulse generator, which increments the pulse counter until the desired preset value is obtained. The above described technique, although quite useful when working at high frequencies, for example over 100 MHz., is also quite costly and complex when such high frequency operation is not required.

In U.S. Pat. No. 4,150,337 issued April 17, 1979, an up-down counter output is prevented from overflowing or underflowing by stopping it when all of the counter output digits are at the same one of a plurality of possible logic levels. The detection of such a condition is accomplished by comparing the logic value of each of the digits with the logic value of at least one other digit and providing a stop signal when all the comparisons are equal. The above described technique suffers from the fact that it requires a relatively large amount of logic to implement and further from the fact that it is limited to detecting only the maximum count possible for the counter being utilized.

It is the general object of the present invention to provide an improved pushbutton actuated counter.

It is another object of the present invention to provide a counter which simulates a rotary-type switch selector.

It is a further object of the present invention to provide a presettable counter which increments by one upon each actuation and provides both a visual and a binary output corresponding to the current count.

These and other objects, features and advantages of the present invention will become more apparent from the detailed description of the preferred embodiment when read in conjunction with the drawing.

SUMMARY OF THE INVENTION

According to the invention, a switching apparatus is provided which simulates a rotary switch in that each time the apparatus is actuated, its output is stepped by one, the actuation corresponding to the turning of a rotary-type switch one position. After a preset maximum count is reached, the output cycles back to the initial starting output, in a fashion analogous to a rotary-type switch being rotated 360 degrees.

The apparatus includes a shift register which is responsive to a momentary contact pushbutton-type input, each output of the shift register being connected to a visual indicator identifying the actuated switch position. In response to the pushbutton being actuated when its output is at its maximum count or in response to an externally supplied power-on-clear input signal, the shift register and its connected output indicators are reset to an initial preset state.

The apparatus additionally includes an adjustable counter, responsive to the same pushbutton-type input, which when reset provides a binary output corresponding to the initial preset count. The binary output of the counter is incremented by one each time the pushbutton-input is actuated and is reset to the initial preset count when the pushbutton is actuated with the apparatus at its maximum count.

BRIEF DESCRIPTION OF THE DRAWING

The FIGURE is a schematic drawing of the preferred embodiment of the present invention.

DETAILED DESCRIPTION OF THE PREFERRED EMBODIMENT

Referring now to the drawing figure, the counting apparatus 10 is initialized by a System Power-On-Clear signal input to the apparatus 10 via line 12. The power-on-clear signal is supplied as conditions in the using system (not shown) warrant. The receipt of a power-on-clear signal actuates the CLR input to counter 14, which in the preferred embodiment is a type 74161 four bit binary counter. As a result, the counter 14 is initialized to zero, a "00" on counter 14 output bits 1-2 corresponding to selection of one of four possible states. The power-on-clear signal also provides an input to OR-gate 16, which when made provides a Parallel Enable (PE) input signal to shift register 18, which in the preferred embodiment is a type 74195 shift register. The power-on-clear signal is also input to debounce circuit 22, and as a result of the delay introduced in passing through the debounce circuit 2, provides a clock pulse to shift register 18 which occurs after the PE input has occurred. As a result of the PE input to shift register 18 being actuated and the subsequently supplied clock pulse, the shift register 18 outputs PROC1-PROC4 are set equal to the values on the associated data input lines 1-4.

In the preferred embodiment, the present invention is implemented to simulate a four position rotary-type switch. That is, after a power-on clear input the apparatus 10 will indicate unit one selected and provide a two-bit binary output of "00". Each subsequent actuation of the pushbutton input 20 will advance the output by one. After unit four selection (count = "11") has been indicated, the next actuation of the pushbutton input 20 will cause the apparatus 10 to indicate the selection of unit one (count = "00"), thus simulating a complete rotation of a rotary-type selector switch.

Referring again to the drawing, it will be assumed that an externally supplied system power-on-clear signal has already been provided on input line 12. At counter 14, the power-on-clear signal caused the count to go to zero, or "0000" to appear on data out lines 1,2,4, and 8 respectively. At shift register 18, since the PE and clock inputs were actuated as a result of the previous system power-on-clear signal, the shift register 18 outputs were set to the input data pattern "1000", thus causing the PROC1 indicator 24 to be actuated. Thus, the first CLK signal resulting from pushbutton 20 being actuated for the first time will cause the shift register 18 contents to be shifted down one position. Thus PROC1-PROC4 would be set equal to "0100". The true output on the PROC2 data out line actuates the PROC2 indicator (not shown) and extinguishes the PROC1 indicator 24. Note that the indicators are integral with and backlight the appropriate positions of the switch lens 26 of pushbutton 20. This first actuation of pushbutton 20 also causes a clocking signal to be fed to counter 14, thus incrementing the counter 14 by one, and resulting in counter 14 outputs 1, 2, 4 and 8 being set to "1000" respectively.

On the next (or second) actuation of pushbutton 20, a second clock signal is sent to the CLK inputs of both counter 14 and shift register 18. The second CLK signal causes the count in counter 14 to increment by one, so that DATA OUT bits 1, 2, 4, 8 become "0100". The second CLK signal to shift register 18 causes a one-bit shift so that data out bits PROC1-PROC4 become "0010". This causes the PROC2 indicator (not shown) to go out and actuates an indicator (not shown) identical to indicator 24, but coupled to the PROC3 output and positioned behind the "3"position of lens 26.

On the next (or third) actuation of pushbutton 20, a third clock signal is sent to the CLK inputs of both counter 14 and shift register 18. The third CLK signal causes the count in counter 14 to increment by one, so that data out bits 1, 2, 4, 8 become "1100", thus causing AND gate 28 to be made, thus actuating the parallel enable (PE) input to counter 14. The third CLK signal to shift register 18 causes a one-bit shift so that data out bits PROC1-PROC4 become "0001". This causes the PROC3 indicator (not shown) to go out and actuates the PROC4 output, thus actuating the PROC4 indicator 30 which is positioned behind the "4" position of indicator lens 26. The actuation of the PROC4 data out bit of shift register 18 also causes OR gate 16 to be made which in turn actuates the PE input to shift register 18.

On the next (or fourth) actuation of pushbutton 20, a fourth clock signal is sent to the CLK inputs of both counter 14 and shift register 18. Since the PE input to counter 14 was set as a result of the third (or last) actuation of pushbutton 20, this fourth actuation causes the data out bit positions of counter 14 to assume the corresponding values on the counter 14 data input lines 1, 2, 4 and 8. Thus, counter 14 data out bits 1, 2, 4, and 8 take on the value "0000". In other words, the four bit counter 14 simulates a two bit binary counter since it sequences from "1100" to "0000". The fourth clock signal to shift register 18 causes a parallel transfer of the data on the shift register 18 data in lines 1-4 to the corresponding data out lines PROC1-PROC4, causing them to be set to "1000" respectively. Thus non-end around shift register 18 has simulated an end around shift register. This causes the PROC4 indicator 30 to go out and actuates the PROC1 indicator 24.

It should be noted that after the fourth actuation of pushbutton 20, the apparatus 10 is in the same state as after the power-on-clear signal was actuated. As will be obvious to those skilled in the art, subsequent actuations of pushbutton 20 will cause the original four state output pattern to be repeated, so that the apparatus 10 simulates a four position rotary-type switching mechanism.

Having shown and described the preferred embodiment of the present invention, those skilled in the art will realize that various omissions, substitutions and changes in forms and details of the present invention may be made without departing from the spirit of the invention. It is the intention, therefore, to be limited only as indicated by the scope of the following claims.

What is claimed is:

1. An apparatus for simulating an n-position rotary-type switch, said apparatus providing an ordered set of n outputs, a next sequential one of said n outputs being selected each time said apparatus is actuated, the sequence of outputs selected being repeated after n actuations of said apparatus, said apparatus comprising:
   input means for initiating the actuation of said apparatus to its next sequential position;
   shift register means, responsive to said input means, for specifying which one of said n sequential positions is selected; and
   enabling means, responsive to the selected one of said n sequential positions from said shift register means, for enabling a preset of said shift register means for subsequently loading a set of preset data into said shift register means upon the $n^{th}$ actuation of the said input means to repeat the said sequence.

2. The apparatus in accordance with claim 1 further including a plurality of indicator means, responsive to said shift register means, for visually indicating the selected one of said n sequential positions.

3. The apparatus in accordance with claim 2 further including counter means, responsive to said input means, for providing a binary coded output corresponding to the selected one of said n-sequential positions.

4. The apparatus in accordance with claim 3 wherein said counter means includes an m bit binary counter, where $2^m$ is at least equal to n.

5. The apparatus in accordance with claim 4 wherein said counter means includes detection means, responsive to said m-bit counter reaching a count corresponding to the value (n-1), for enabling a reset of said counter means to an initial count.

6. The apparatus in accordance with claim 5 wherein said enabling means is further responsive to a user supplied external input.

7. The apparatus in accordance with claim 5 wherein said shift register means includes a parallel-access shift register having an n-bit data input and an n-bit data output, said enabling means responsive to the presence of a true bit in the high order bit position of said n-bit data output, said set of preset data including a true bit in its low order bit position.

8. The apparatus in accordance with claim 7 further including counter means, responsive to said input means, for providing a binary coded output corresponding to the selected one of said n-sequential positions.

9. The apparatus in accordance with claim 8 wherein said counter means includes an m bit binary counter, where $2^m$ is at least equal to n.

10. The apparatus in accordance with claim 9 wherein said counter means includes detection means, responsive to said m-bit counter reaching a count corresponding to the value (n-1), for enabling a reset of said counter to an initial count.

11. The aparatus in accordance with claim 7 wherein said shift register means, in response to said input means, will shift the contents of said shift register one bit position toward the corresponding high order position of said shift register.

12. The apparatus in accordance with claim 11 wherein said plurality of indicator means includes n indicator means, each one of said n indicator means responsive to the presence of a true bit in one of the shift register's n-data output bit positions.

* * * * *